United States Patent
Hwang

(10) Patent No.: US 6,612,868 B2
(45) Date of Patent: Sep. 2, 2003

(54) SMALL FORM-FACTOR PLUGGABLE TRANSCEIVER CAGE

(75) Inventor: Jenq-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/120,665

(22) Filed: Apr. 10, 2002

(65) Prior Publication Data

US 2003/0100204 A1 May 29, 2003

Related U.S. Application Data

(63) Continuation-in-part of application No. 09/996,123, filed on Nov. 27, 2001.

(51) Int. Cl.[7] .............................................. H01R 13/648
(52) U.S. Cl. ...................................... 439/607; 385/92
(58) Field of Search ................................ 439/607–610, 439/92, 95, 939; 385/92, 88, 89; 361/752, 756, 802

(56) References Cited

U.S. PATENT DOCUMENTS

| | | | | |
|---|---|---|---|---|
| 6,135,790 A | * | 10/2000 | Huang et al. | 439/607 |
| 6,142,828 A | * | 11/2000 | Pepe | 439/607 |
| 6,165,014 A | * | 12/2000 | Kao et al. | 439/607 |
| 6,178,096 B1 | * | 1/2001 | Flickinger et al. | 439/816 |
| 6,203,336 B1 | * | 3/2001 | Nakamura | 439/607 |
| 6,364,709 B1 | * | 4/2002 | Jones | 439/607 |
| 6,368,153 B1 | * | 4/2002 | Hwang | 439/607 |
| 6,416,361 B1 | * | 7/2002 | Hwang | 439/607 |
| 6,419,523 B1 | * | 7/2002 | Jones et al. | 439/607 |

* cited by examiner

Primary Examiner—Gary Paumen
(74) Attorney, Agent, or Firm—Wei Te Chung

(57) ABSTRACT

An SFP transceiver cage (1) comprises a mainframe (10) and a rectangular grounding device (90) mounted around a front portion of the mainframe. The mainframe includes two sidewalls (2a, 2b), a sidewall cover (3), a top plate (4), a bottom wall (5), and a rear cover. The mainframe and grounding device are each preferably made from a single piece of metal plate. A central spring latch (52) is formed at a bottom of the mainframe, and two kick-out spring arms (8a, 8b) respectively extend from rear edges of the sidewalls. Each kick-out spring arm has a frontmost portion (83) resiliently abutting against a rear wall (406) of a corresponding SFP transceiver module (400) inserted into the cage, and a second portion (82) resiliently abutting against the rear cover of the cage. The module is thus resiliently and securely received in the cage.

23 Claims, 14 Drawing Sheets

SMALL FORM-FACTOR PLUGGABLE TRANSCEIVER CAGE

Cross-Reference to Related Application

This application is a continuation-in-part of U.S. Ser. No. 09/996,123, filed on Nov. 27, 2001 and related to U.S. Ser. No 09/827,859, U.S. Pat. No. 6,364,709, U.S. Pat. No. 6,419,523, U.S. Pat. No. 6,416,361, U.S. Pat. No. 6,368,153, and U.S. Ser. No. 09/991,322.

BACKGROUND OF THE INVENTION

1. Field of the Invention

The present invention relates to an optical transceiver cage, and more particularly to a small form-factor pluggable (SFP) transceiver cage of a high data transfer rate program gigabit interface converter (GBIC).

2. Description of the Related Art

Transceiver modules provide bi-directional transmission of data between an electrical interface and an optical data link. The module receives electrically encoded data signals and converts them into optical signals, which are then transmitted over the optical data link. The module also receives optically encoded data signals, converts them into electrical signals, and transmits the electrical signals to the electrical interface.

Normally, the transceiver module is mounted on a printed circuit board (PCB) assembly of a host computer, an input/output system, a peripheral device, or a switch. An SFP transceiver module is inserted into a complementary metal cage assembly mounted on the PCB. The metal cage generally has two parallel sidewalls, a rectangular top, a rectangular bottom, and front and rear ends. The metal cage provides easy interconnection, and is easily installed on the PCB. The metal cage functions to dissipate electrostatic buildup, and serves as an electromagnetic shield.

A conventional cage has an entrance portion that is mounted in an opening of an orthogonal panel. A plurality of outwardly projecting grounding tabs adjacent the entrance portion of the cage abuts against edges of the panel that bound the opening. The cage further includes a spring latch at the entrance portion for engaging an SFP transceiver module, and spring arms at a rear portion of the cage for resiliently ejecting the transceiver module. The spring latch is partially received in the opening of the panel. A gap exists between the spring latch and an edge of the panel that bounds the opening. In use, electromagnetic interference (EMI) passes through the gap. The cage does not provide adequate protection for the connecting interface from EMI. In addition, the resilient force exerted by the spring arms on the SFP transceiver module is generally weak. As a result, the SFP transceiver module is liable to be accidentally released from engagement with the cage when the cage is subjected to vibration during normal operation.

Furthermore, there are no structures specifically for establishing grounding of a housing of the SFP transceiver module that is engaged in the cage. Moreover, the cage forms legs for supporting the cage on the PCB, but there is no board locking mechanism to safeguard reflowing of solder during soldering of the cage to the PCB. The cage is liable to disengage from the PCB, causing poor soldering.

SUMMARY OF THE INVENTION

Accordingly, an object of the present invention is to provide an SFP transceiver cage that gives excellent protection from EMI when the cage is mounted to a panel.

Another object of the present invention is to provide an SFP transceiver cage which prevents an inserted SFP transceiver from being accidentally released from the cage even when subjected to vibration.

A further object of the present invention is to provide an SFP transceiver cage which has ample grounding structures to facilitate grounding and prevent EMI.

A still further object of the present invention is to provide an SFP transceiver cage having legs that enable the cage to be locked on a PCB during soldering of the cage to the PCB.

A yet still further object of the present invention is to provide a sturdy SFP transceiver cage that is easily and inexpensively made essentially from a single metal plate.

To achieve the above objects, an SFP transceiver cage in accordance with a preferred embodiment of the present invention comprises a mainframe and a rectangular grounding device mounted around a front portion of the mainframe. The mainframe includes two sidewalls, a sidewall cover, a top plate, a bottom wall and a rear cover. The mainframe and grounding device are each preferably made from a single piece of metal plate. A plurality of inward grounding fingers is formed on a top, bottom and sides of a front portion of the mainframe. A plurality of outward grounding fingers is formed on a top, bottom and sides of the grounding device, symmetrically opposite the inward grounding fingers of the mainframe. A central spring latch is formed at the bottom of the front portion of the mainframe, and two kick-out spring arms respectively extend inwardly from rear edges of the sidewalls.

A plurality of compliant legs, needle eye legs and support legs depends from the sidewalls of the mainframe. The compliant and needle eye legs are extended through corresponding holes defined in a PCB, and prevent the cage from moving relative to the PCB during the course of solder reflowing. The support legs abut a face of the PCB. The support legs serve as standoffs, separating the cage from the PCB to facilitate accurate soldering.

A front portion of the cage is mounted in an opening of an orthogonal panel, leaving a gap between the panel and the cage. The grounding device mounted around the front portion of the mainframe substantially fills the gap. The outward grounding fingers of the grounding device resiliently engage with edges of the panel that surround the opening. The central outward spring tab serves as an EMI shield for any EMI that may pass through a gap existing between the panel and a spring latch of the mainframe. An SFP transceiver module having a conductive outer surface is inserted into the cage, with a rear part of the SFP transceiver module abutting against the kick-out spring arms. The SFP transceiver module has a buckle engaged in a corresponding hole in the central outward spring latch of the cage. The kick-out spring arms of the mainframe are configured to resiliently and firmly secure the buckle of the SFP transceiver module in the hole in the central spring Latch. The inward grounding fingers of the mainframe resiliently engage with the conductive outer surface of the SFP transceiver module. The inward and outward grounding fingers and central outward spring tab cooperate to establish multiple grounding paths between the SFP transceiver module and the mainframe, grounding device and panel.

Other objects, advantages and novel features of the present invention will be apparent from the following detailed description of preferred embodiments thereof with reference to the attached drawings, in which:

DETAILED DESCRIPTION OF THE PREFERRED EMBODIMENTS

Figure 1:
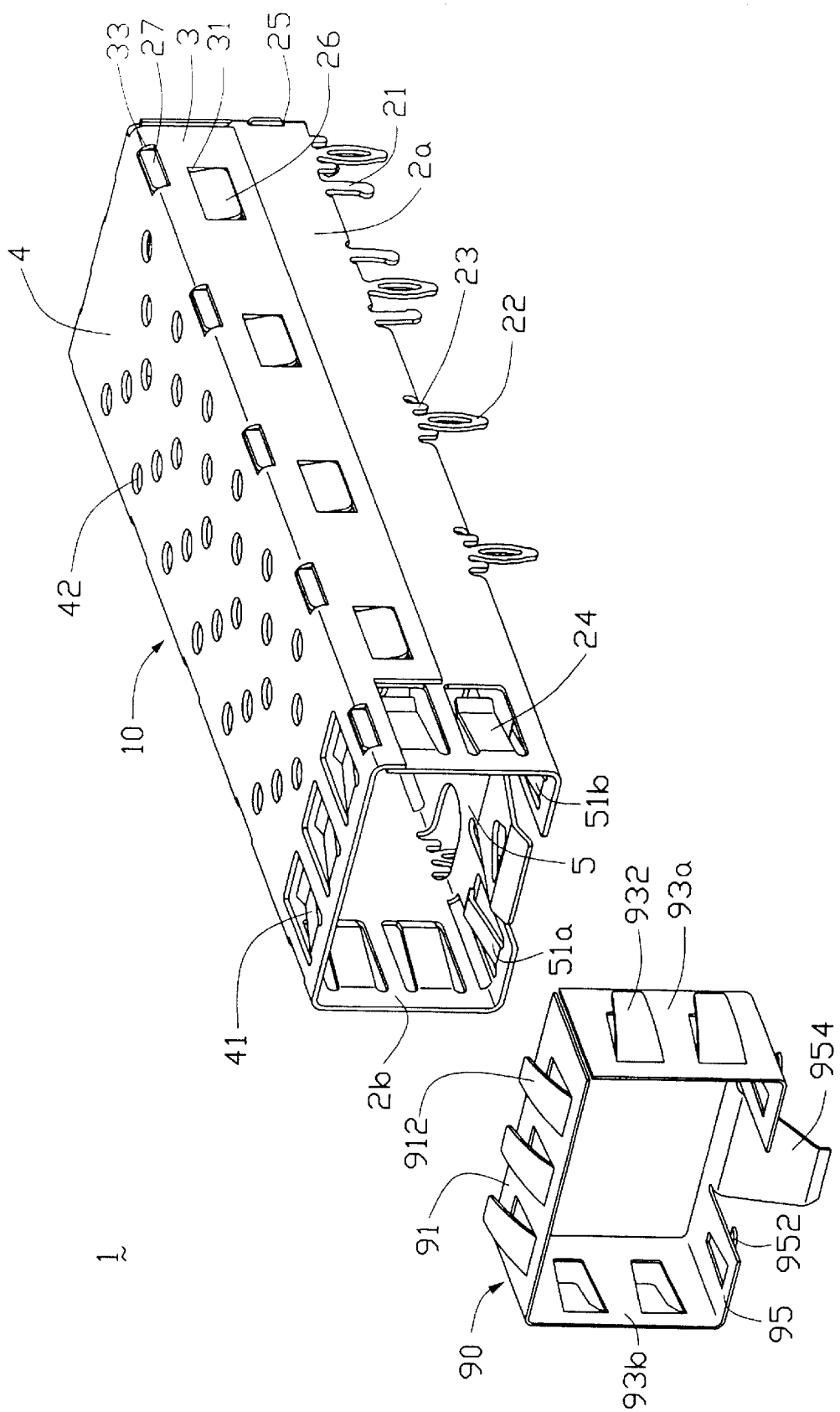
FIG. 1 is an exploded view of an SFP transceiver cage in accordance with a preferred embodiment of the present invention.
Figure 2:
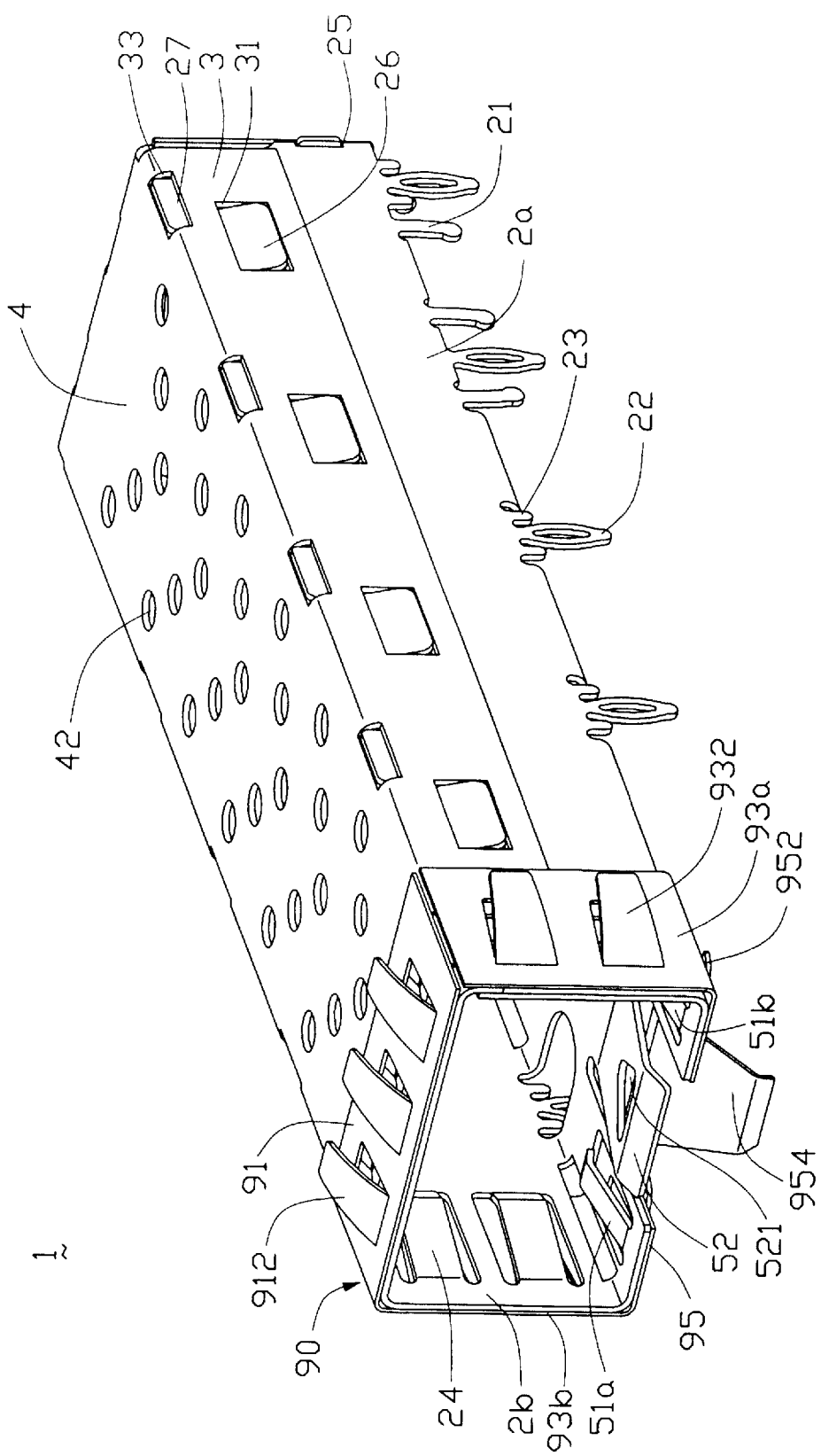
FIG. 2 is an assembled view of FIG. 1.
Figure 3:
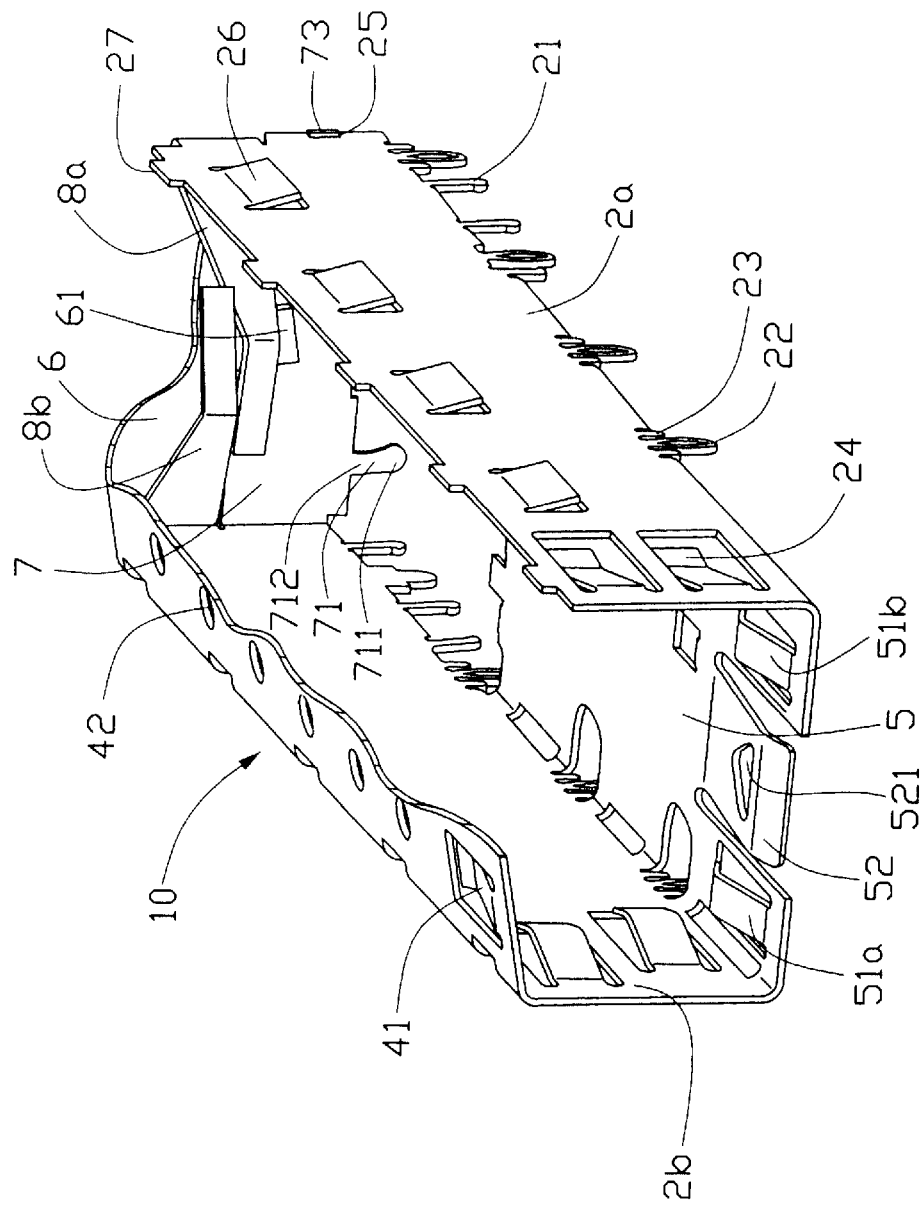
FIG. 3 is a perspective view of a mainframe of the cage of FIG. 1, showing the mainframe prior to its assembly, and with a portion of the mainframe cut away for better illustration.

Referring to FIGS. 1–3; a small form-factor pluggable (SFP) transceiver cage 1 in accordance with a preferred embodiment of the present invention comprises a mainframe 10 and a rectangular grounding device 90. The mainframe 10 comprises a first sidewall 2a, a second sidewall 2b, a sidewall cover 3, a top plate 4, a bottom wall 5, a rear cover, and two kick-out spring arms 8a, 8b. The rear cover includes an outer plate 6 and an inner plate 7. The mainframe 10 is generally parallelepiped, and preferably made from a single piece of blank material such as a metal plate. The mainframe 10 may alternatively be made from two pieces of blank material. The grounding device 90 is preferably made from a single piece of blank material such as a metal plate, and is mounted around a front portion of the mainframe 10.

Each sidewall 2a, 2b forms two inward grounding fingers 24 proximate a front end thereof, and a plurality of compliant legs 21, needle eye legs 22 and support legs 23 depending from a lower edge thereof. The first sidewall 2a also forms a plurality of resilient clasps 26 along an upper portion thereof, and a plurality of locating tabs 27 along a top edge thereof. A small notch 25 is defined in a rear edge of the first sidewall 2a.

The sidewall cover 3 extends from the top plate 4 and overlaps an upper portion of the first sidewall 2a. A plurality of horizontally aligned windows 31 is defined in the sidewall cover 3, for engagingly receiving the clasps 26 of the first sidewall 2a. A plurality of rectangular slots 33 is defined in a junction of the sidewall cover 3 and the top plate 4, for engagingly receiving the locating tabs 27 of the first sidewall 2a. The top plate 4 forms three inward grounding fingers 41 at a front portion thereof. A plurality of bores 42 is defined in middle and rear portions of the top plate 4.

Figure 4:
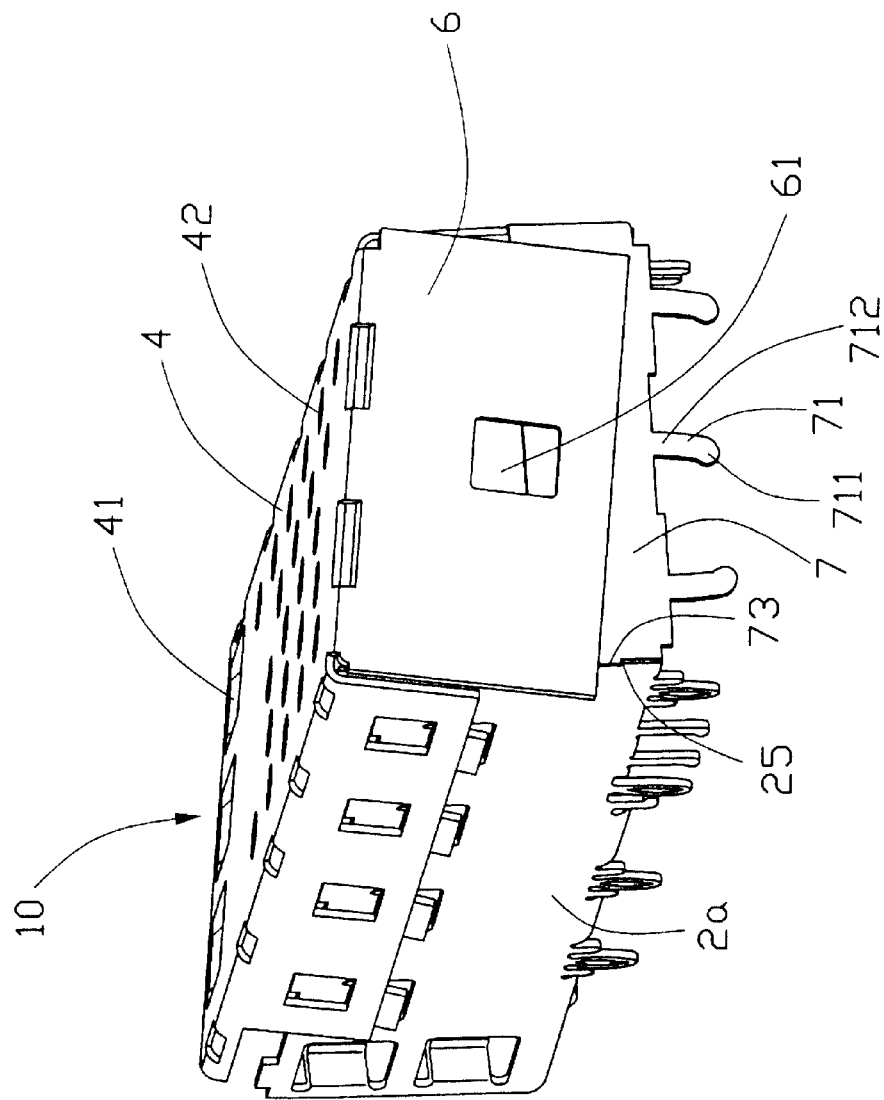
FIG. 4 is a perspective view of the mainframe of the cage of FIG. 1, showing the mainframe prior to its assembly, and viewed from a rear aspect.
Figure 5:
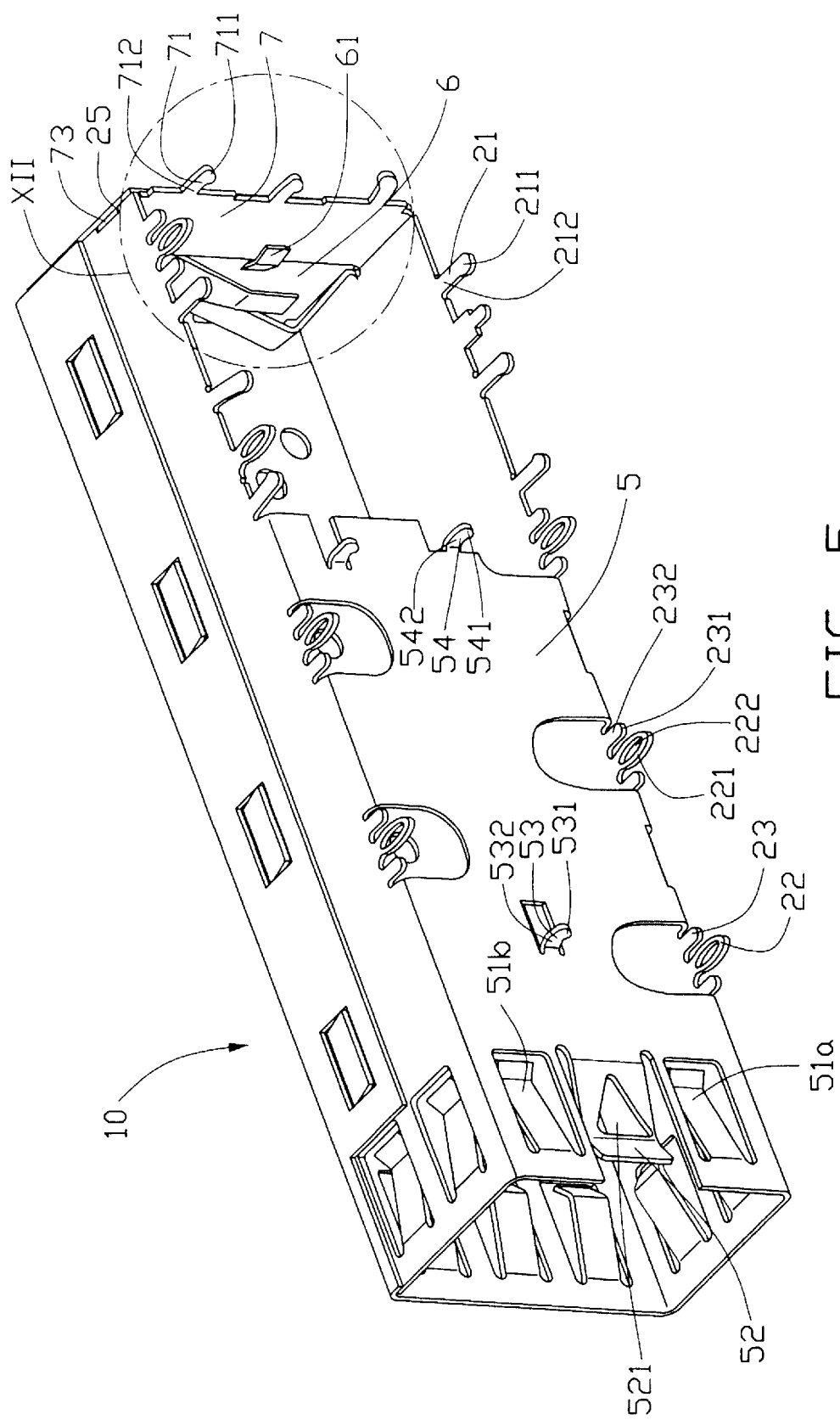
FIG. 5 is a perspective view of the mainframe of the cage of FIG. 1, but viewed from a bottom aspect.

Referring to FIGS. 3–5, the outer plate 6 of the rear cover extends from the top plate 4. An inward spring tab 61 extends from an inner face of the outer plate 6, for engaging the inner plate 7. The inner plate 7 extends from the second sidewall 2b. A plurality of compliant legs 71 depends from a lower edge of the inner plate 7. A projection 73 is formed at a free end of the inner plate 7, for engaging in the notch 25 of the first sidewall 2a.

The bottom wall 5 is shorter than the top plate 4. A central spring latch 52 is formed in a front portion of the bottom wall 5. The spring latch 52 extends slightly upwardly into the mainframe 10, and defines a hole 521 therein. Two inward grounding fingers 51a, 51b are formed in a front portion of the bottom wall 5, on opposite sides of the spring latch 52, respectively. A distance between the two inward grounding fingers 51a, 51b is greater than a distance between the two inward grounding fingers 24 on the first sidewall 2a, and greater than a distance between the two inward grounding fingers 24 on the second sidewall 2b. This ensures that the spring latch 52 has sufficient elastic strength. A central compliant leg 53 depends from the bottom wall 5 rearward of the spring latch 52. Two rear compliant legs 54 depend from near a rear edge of the bottom wall 5.

Referring particularly to FIG. 5, the compliant legs 21, needle eye legs 22 and support legs 23 are all substantially co-planar with their respective corresponding sidewalls 2a, 2b. Each compliant leg 21, 53, 54, 71 respectively comprises an elongate body 212, 532, 542, 712 and an offset rounded end 211, 531, 541, 711. The offset rounded end 211 is offset such that it slightly extends either toward a front of the mainframe 10, or toward a rear of the mainframe 10. Each offset rounded end 531, 541, 711 is offset such that it slightly extends either toward the first sidewall 2a, or toward the second sidewall 2b. Each needle eye leg 22 comprises an elliptical body 221, and an elliptical hole 222 defined in a middle of the elliptical body 221. A width of the elliptical body 221 is dimensioned so that the needle eye leg 22 can press-fit into a printed circuit board (PCB) 300 (see FIG. 6). Each support leg 23 comprises an elongate body 232, and a rounded end 231.

Figure 12:
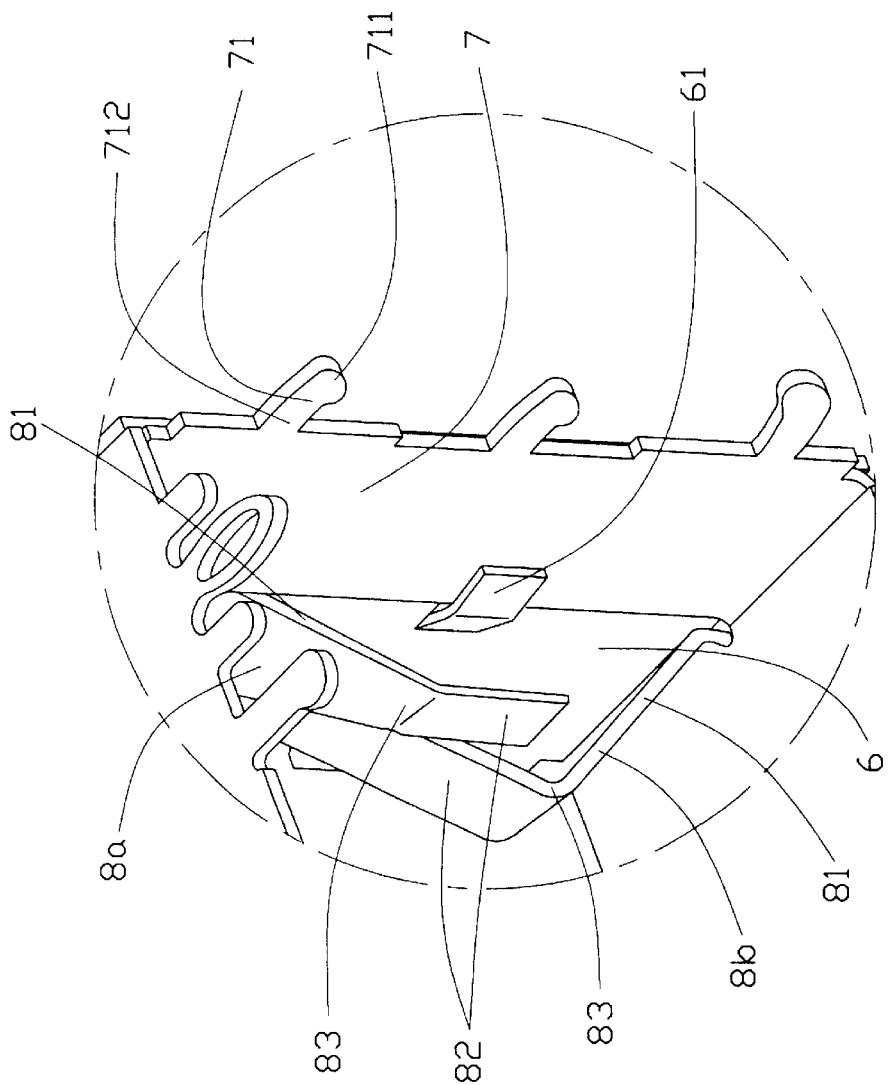
FIG. 12 is an enlarged view of a circled portion XII of FIG. 5, showing a rear portion of the mainframe of the cage of FIG. 1.
Figure 13:
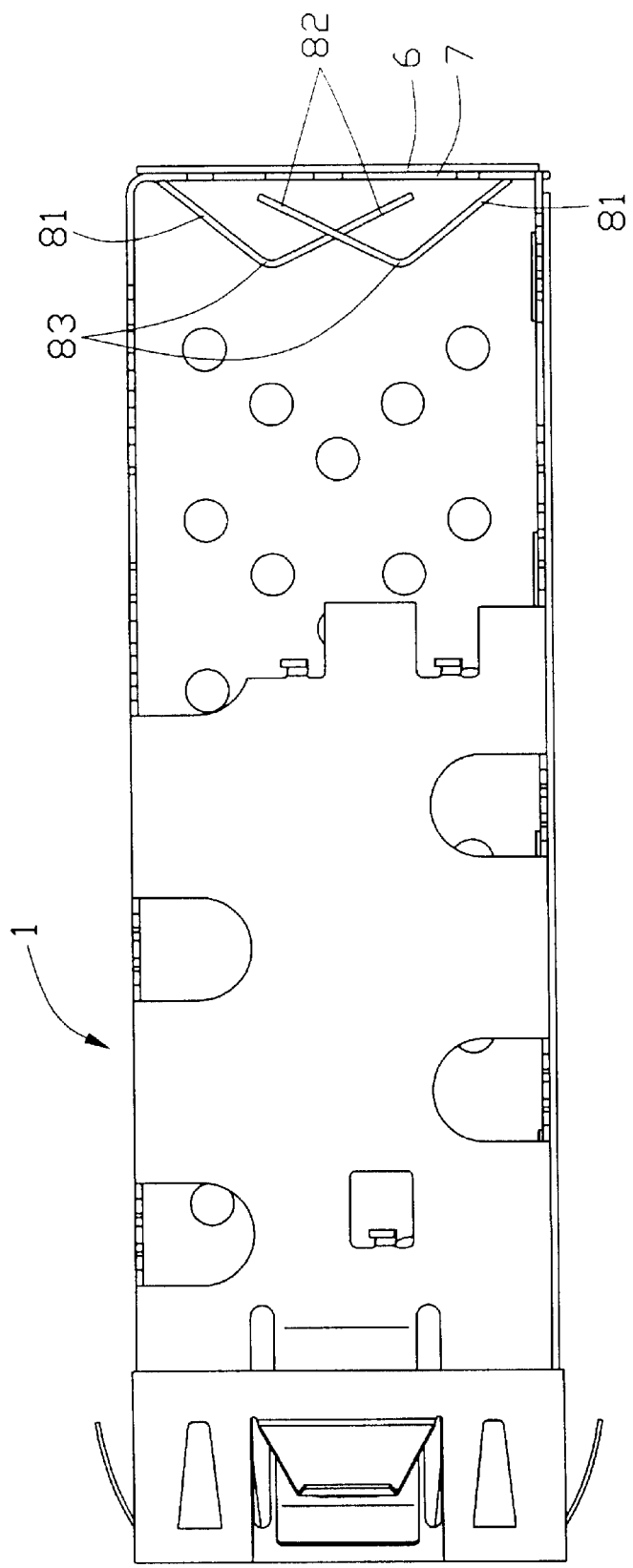
FIG. 13 is a bottom plan view of FIG. 2.

Referring also to FIGS. 12 and 13, the kick-out spring arms 8a, 8b extend inwardly from rear edges of the first and second sidewalls 2a, 2b respectively. A length of each kick-out spring arm 8a, 8b is less than a width of the outer plate 6. Each kick-out spring arm 8a, 8b has a first portion 81 and a second portion 82. Each first portion 81 integrally extends from the corresponding rear edge of the first and second sidewalls 2a, 2b obliquely inwardly toward a corresponding opposite second or first sidewall 2b, 2a and toward the front portion of the mainframe 10. Each second portion 82 integrally extends at an obtuse angle from a distal end of a corresponding first portion 81 toward the corresponding opposite second or first sidewall 2b, 2a and toward the outer plate 6 of the mainframe 10. A frontmost portion 83 is thus defined in each kick-out spring arm 8a, 8b between the first and second portions 81, 82. Each first portion 81 tapers from the corresponding rear edge of the first and second sidewalls 2a, 2b toward the frontmost portion 83. The kick-out spring arms 8a, 8b thus have preferred elasticity and flexibility characteristics.

Referring back to FIGS. 1 and 2, the grounding device 90 includes a top cover 91, a bottom plate 95 opposite to the top cover 91, and first and second parallel sidewalls 93a, 93b between the top cover 91 and bottom plate 95. The second sidewall 93b is integrally connected to both the top cover 91 and the bottom plate 95. The first sidewall 93a is integrally connected only to the bottom plate 95. Three outward grounding fingers 912 are formed on the top cover 91. Two outward grounding fingers 932 are formed on each sidewall 93a, 93b. Two outward grounding fingers 952 are formed on the bottom plate 95. A central outward spring tab 954 is formed in a middle portion of the bottom plate 95. The outward grounding fingers 952 are disposed on opposite sides of the central outward spring tab 954 respectively.

In assembly of the mainframe 10, the projection 73 of the inner plate 7 is engaged in the notch 25 of the first sidewall 2a. The top plate 4 and side cover 3 are bent such that the side cover 3 is fastened over first sidewall 2a. The inward spring tab 61 of the outer plate 6 engages the inner plate 7, thereby fixing the outer plate 6 in place. The clasps 26 of the first sidewall 2a are engaged in the windows 31 of the side cover 3. The locating tabs 27 of the first sidewall 2a are engaged in the rectangular slots 33. The sidewall cover 3 is thereby secured to the first sidewall 2a, forming the mainframe 10. The kick-out spring arms 8a, 8b are located generally above the inner plate 7. The second portions 82 of the kick-out spring arms 8a, 8b cross over each other generally one above the other. A free end of each second portion 82 is spaced a small distance from the outer plate 6 of the mainframe 10.

In assembly of the cage 1, the grounding device 90 is mounted around the front portion of the mainframe 10. This is done by conventional means such as spot welding or adhesion. Alternatively, the grounding device 90 may be hooked onto the front portion of the mainframe 10 using hooks (not shown). Each outward grounding finger 912, 932, 952 of the grounding device 90 is disposed symmetrically opposite a corresponding inward grounding finger 41, 24, 51a and 51b respectively of the top plate 4, sidewalls 2a,2b and bottom wall 5 of the mainframe 10. The central outward spring tab 954 is disposed under the spring latch 52 of the bottom wall 5. A free end of the central outward spring tab 954 is disposed below a front portion of the cage 1.

Figure 6:
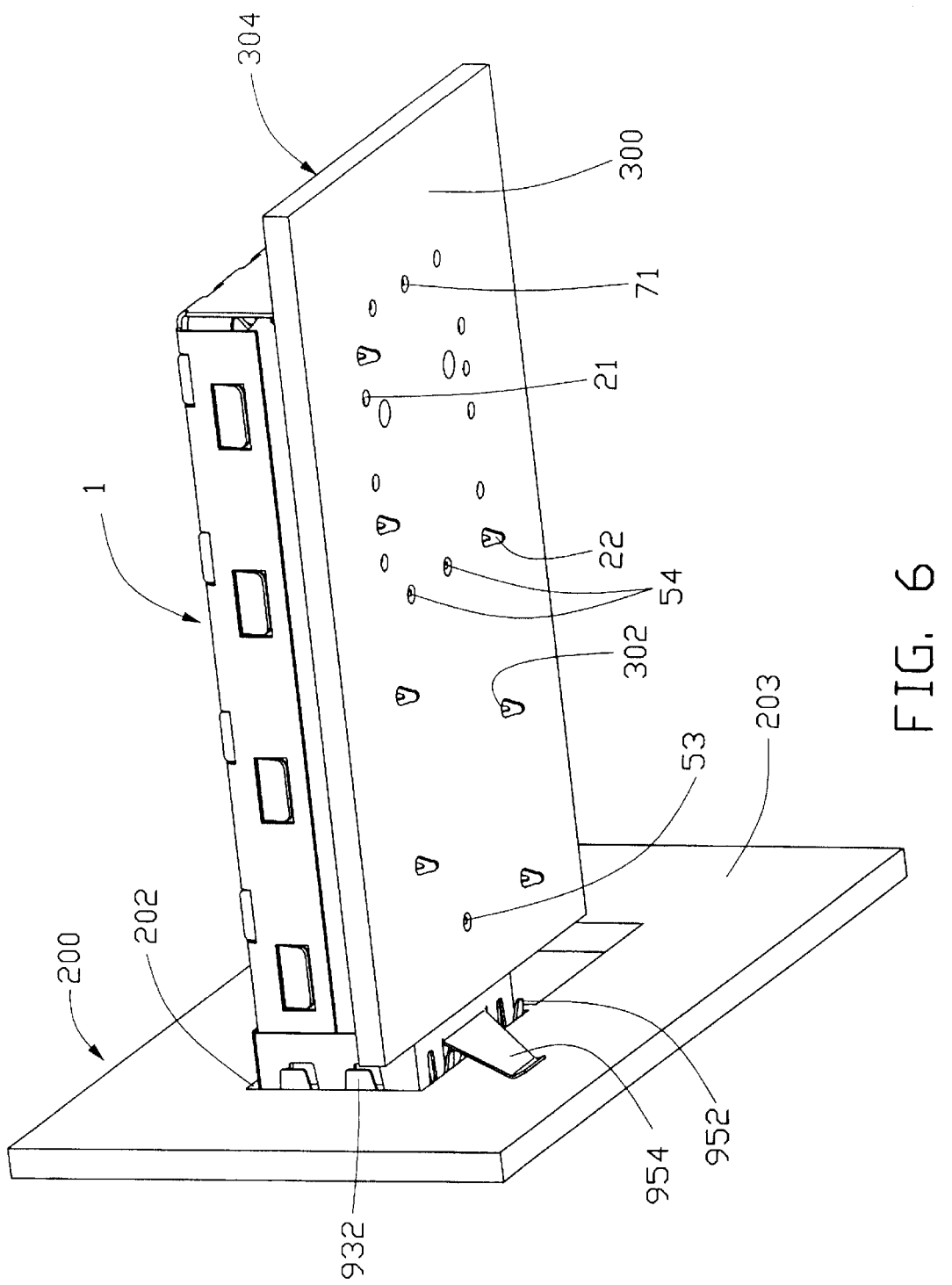
FIG. 6 is a perspective view of the cage of FIG. 2 mounted on a printed circuit board, and further mounted in an opening of an orthogonal panel.

Referring particularly to FIGS. 5 and 6, in mounting the cage 1 to the PCB 300, the compliant legs 21, 53, 54, 71 and needle eye legs 22 are extended through corresponding apertures 302 defined in the PCB 300. The offset rounded ends 211, 531, 541, 711 respectively of the compliant legs 21, 53, 54, 71 resiliently press against the PCB 300 in the corresponding apertures 302. The needle eye legs 22 are press-fitted into the corresponding apertures 302 of the PCB 300. The support legs 23 abut a top face 304 of the PCB 300. The offset rounded ends 211, 531, 541, 711 respectively of the compliant legs 21, 53, 54, 71 and the elliptical bodies 221 of the needle eye legs 22 lock the cage 1 on the PCB 300. Thus the cage 1 can be firmly and stably secured on the PCB 300 with or without soldering. If the cage 1 is secured on the PCB 300 with soldering, the compliant legs 21, 53, 54, 71 and needle eye legs 22 prevent the cage 1 from moving relative to the PCB 300 during the course of solder reflowing. Furthermore the support legs 23 serve as standoffs, separating other parts of the cage 1 from the PCB 300 to facilitate accurate soldering.

The combined cage 1 and PCB 300 is then attached to a panel 200. The panel 200 defines at least one opening 202, and is orthogonal to the PCB 300. The front portion of the mainframe 10 with the grounding device 90 is inserted into the opening 202 of the panel 200. The outward grounding fingers 912, 932, 952 of the grounding device 90 resiliently abut against corresponding edges (not labeled) of the panel 200 that surround the opening 202. The central outward spring tab 954 resiliently abuts against an inner face 203 of the panel 200. A gap (not labeled) is defined between the spring latch 52, the grounding fingers 51a, 51b and a bottom edge of the panel 200 that bounds the opening 202. The central outward spring tab 954 serves as an electromagnetic interference (EMI) shield for any EMI that may pass through the gap. At the same time, the central outward spring tab 954 provides sufficient space for the spring latch 52 to move down and up during engagement and disengagement of a corresponding SFP transceiver module 400 (see FIG. 10) in and from the cage 1.

Figure 10:
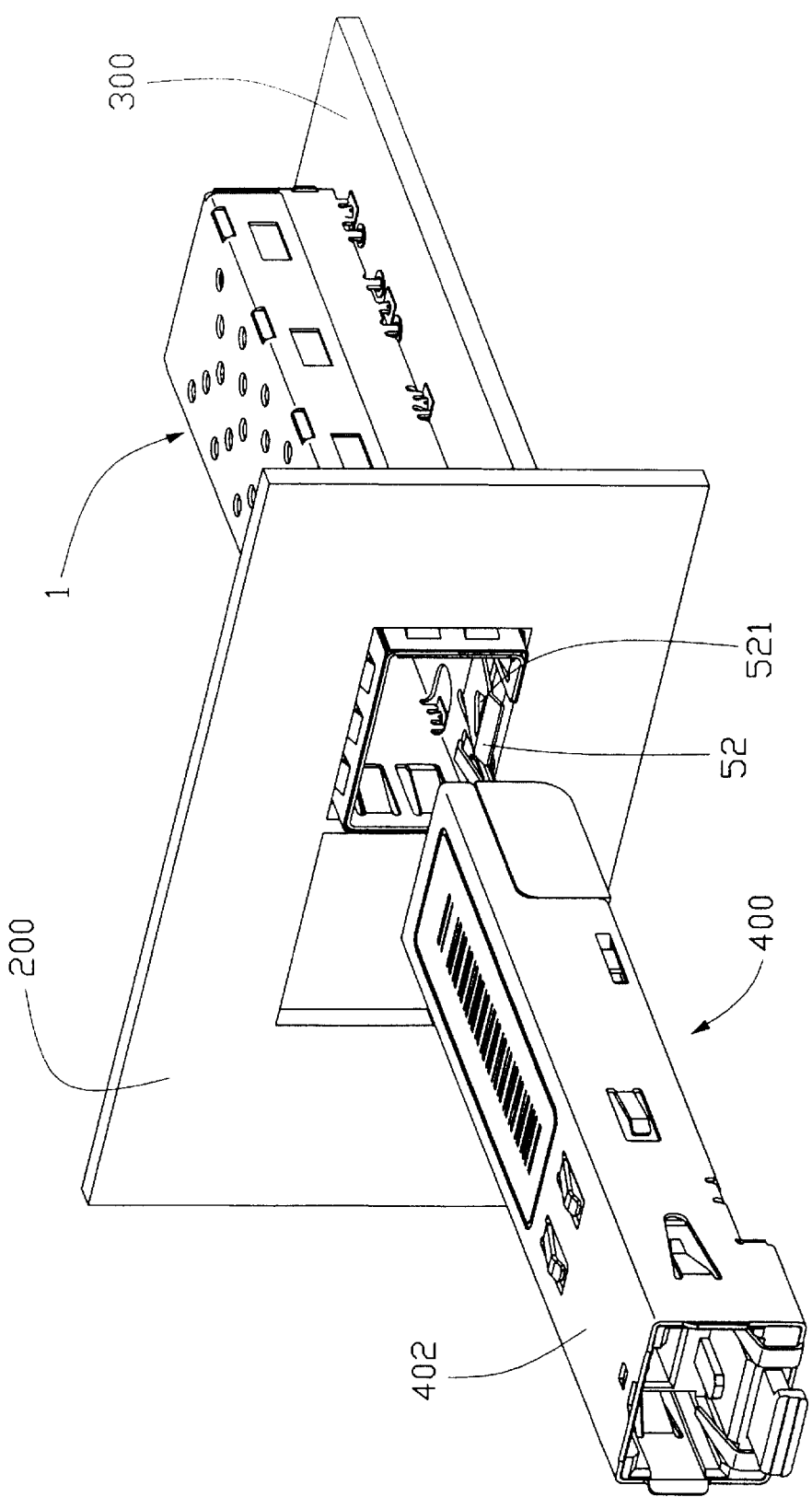
FIG. 10 is similar to FIG. 6, but viewed from another aspect and showing an SFP transceiver module ready to be inserted into the cage.
Figure 11:
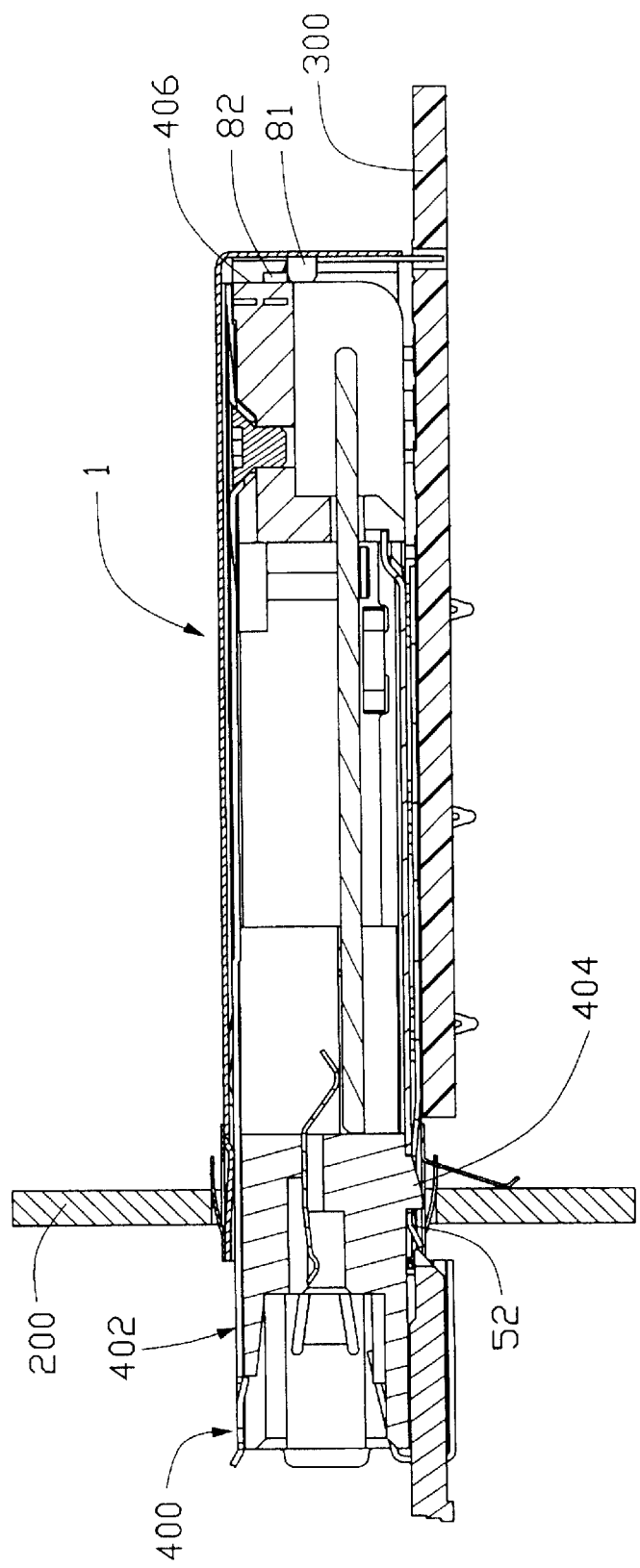
FIG. 11 is a cross-sectional view of FIG. 6, but also showing the SFP transceiver module fully inserted into the cage.
Figure 14:
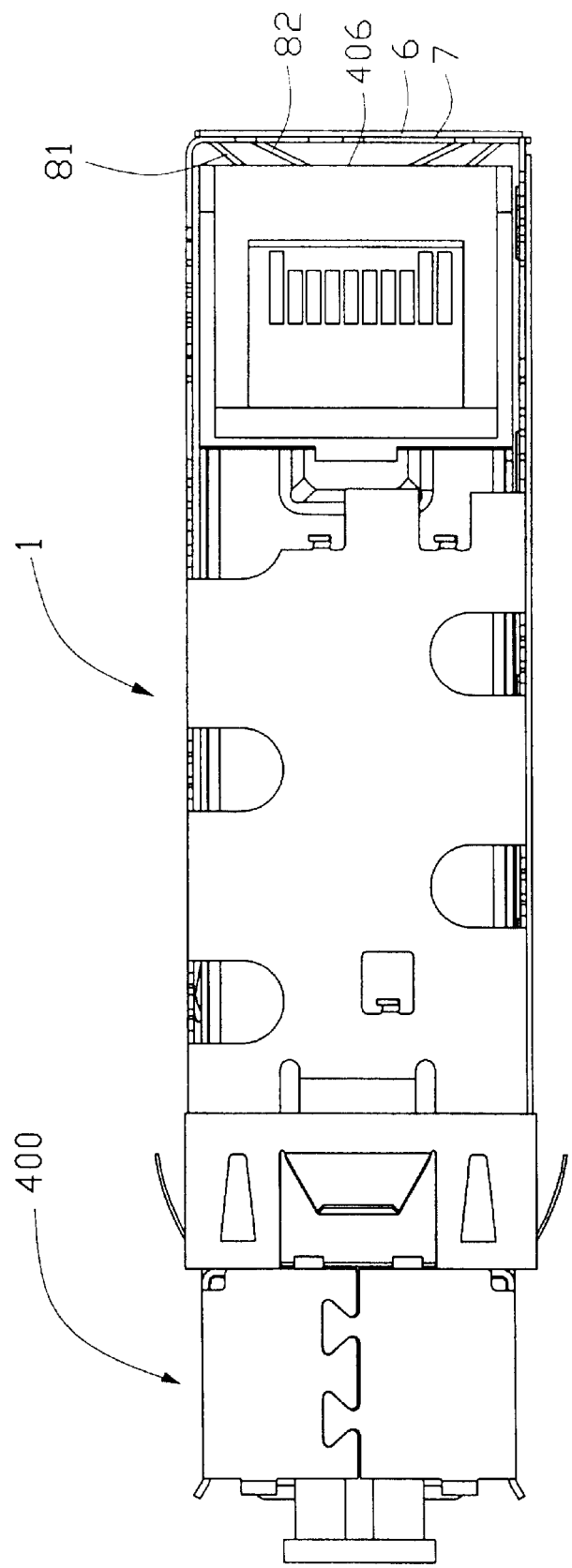
FIG. 14 is similar to FIG. 13, but showing the SFP transceiver module fully inserted into the cage.

Referring to FIGS. 10, 11 and 14, the SFP transceiver module 400 has a conductive outer surface 402, a metal buckle 404 and a rear wall 406. The metal buckle 404 is shaped to correspond to the hole 521 of the central spring latch 52 of the cage 1. When the SFP transceiver module 400 is inserted into the cage 1, the rear wall 406 of the SFP module 400 presses the two frontmost portions 83 of the kick-out spring arms 8a, 8b. The first and second portions 81, 82 of the kick-out spring arms 8a, 8b are deformably moved toward the outer plate 6 until the free ends of the second portions 82 slidingly abut against an inner surface of the outer plate 6. The metal buckle 404 press-fits into the hole 521, and the SFP transceiver module 400 is thereby resiliently and securely engaged in the cage 1. Even when the cage 1 is subjected to vibration, the SFP transceiver module 400 cannot escape from the cage 1. The configuration of the kick-out spring arms 8a, 8b also facilitates resilient ejection of the SFP transceiver module 400 from the cage 1 when the metal buckle 404 is manually released from the hole 521. The inward grounding fingers 24, 41, 51a, 51b respectively of the sidewalls 2a, 2b, top plate 4 and bottom wall 5 resiliently contact the conductive outer surface 402 of the SFP transceiver module 400. Thus the inward grounding fingers 24, 41, 51a, 51b, outward grounding fingers 912, 932, 952 and central outward spring tab 954 cooperate to establish multiple grounding paths between the SFP transceiver module 400, mainframe 10, grounding device 90 and panel 200. The cage 1 thereby provides numerous grounding paths to prevent EMI.

Figure 7:
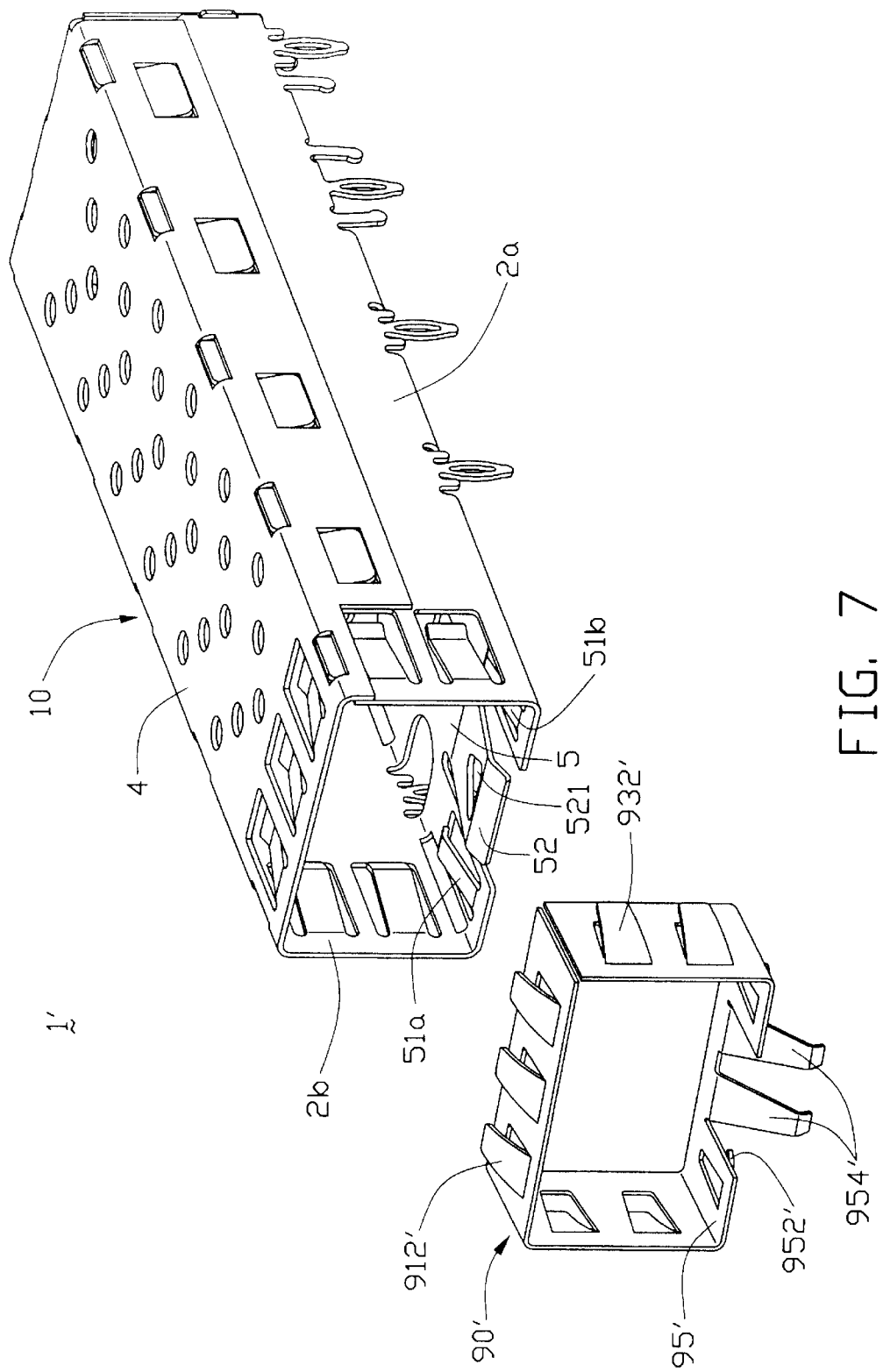
FIG. 7 is a exploded view of an SFP transceiver cage in accordance with an alternative embodiment of the present invention.
Figure 8:
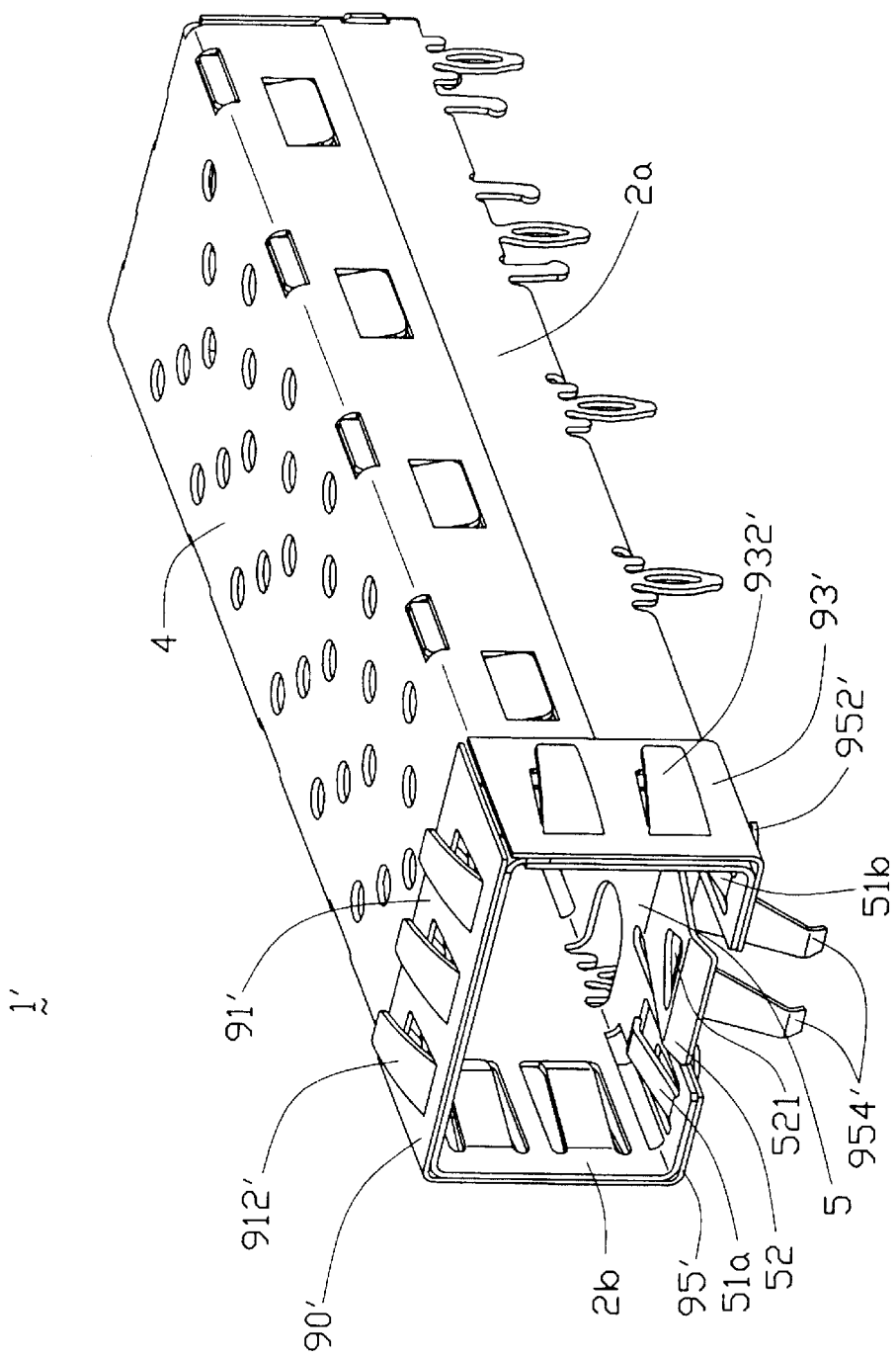
FIG. 8 is an assembled view of FIG. 7.
Figure 9:
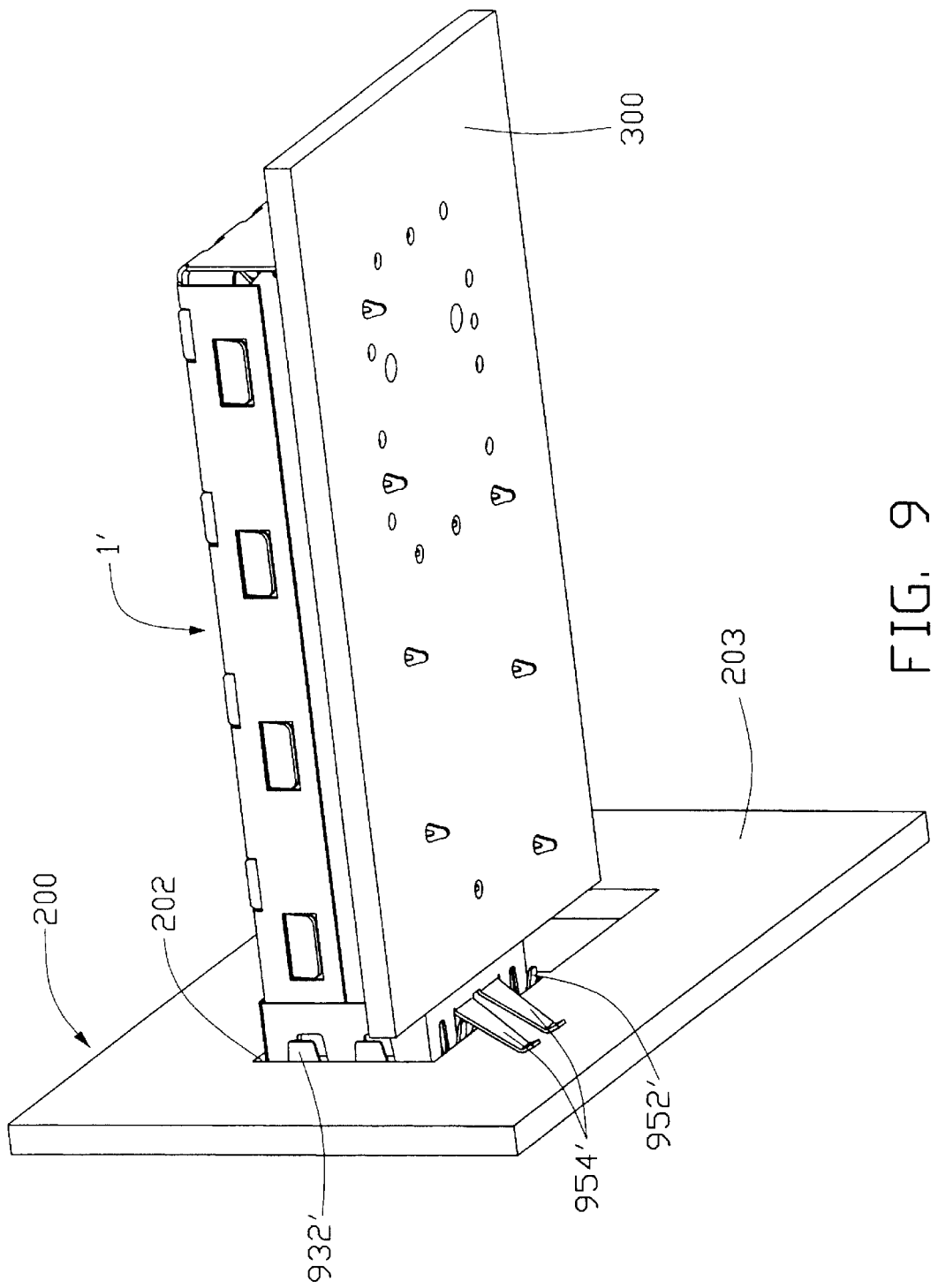
FIG. 9 is a perspective view of the cage of FIG. 8 mounted on a printed circuit board, and further mounted in an opening of an orthogonal panel.

Referring to FIGS. 7–9, an SFP transceiver cage 1' in accordance with an alternative embodiment of the present invention has a structure similar to that of the SFP transceiver cage 1 of the preferred embodiment. However, the cage 1' comprises a rectangular grounding device 90' instead of the grounding device 90 of the preferred embodiment. The grounding device 90' forms two central outward spring tabs 954' in a middle portion of a bottom plate 95' thereof. Two outward grounding fingers 952' are formed on opposite sides of the central outward spring tabs 954'. The grounding device 90' also has outward grounding fingers 912', 932' respectively formed on a top cover 91' and sidewalls 93' thereof. Free ends of the central outward spring tabs 954' are disposed below a front of the cage 1'. The central outward spring tabs 954' resiliently abut against the inner face 203 of the panel 200. The inward grounding fingers 24, 41, 51a, 51b of the mainframe 10, outward grounding fingers.912', 932', 952' and central outward spring tab 954' cooperate to establish multiple grounding paths between the SFP transceiver. module 400, mainframe 10, grounding device 90' and panel 200. The cage 1' thereby provides numerous grounding paths to prevent EMI.

In a further alternative embodiment of the present invention, the grounding device is a grounding plate attached on the bottom wall 5 of the mainframe 10. At least one central outward spring tab is formed on the grounding plate. The grounding plate functions in the same way as described above in relation to the grounding devices 90, 90' of the cages 1, 1'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A transceiver cage, comprising:
    a metal housing defining an entrance, and a rear portion opposite to the entrance; and
    at least one extending from the rear portion and including a free end, wherein the free end substantially abuts against the rear portion when a transceiver is received therein, and bounce away from the rear portion when the transceiver is removed therefrom.

2. The cage as described in claim 1 further comprising two sidewalls, the spring arms respectively extend generally toward each of the two sidewalls and cross over each other.

3. The cage as described in claim 2, wherein the spring arms respectively extend from the two sidewalls.

4. The cage as described in claim 3, wherein each of the spring arms comprises a first portion adjoining a corresponding sidewall, and a second portion distal from the corresponding sidewall, and wherein the first portion tapers from the corresponding side wall toward the second portion.

5. The cage as described in claim 4, wherein the first portion obliquely extends from the corresponding sidewall substantially toward the opposite sidewall of the two sidewalls and toward a front of the cage, and the second portion extends from the first portion substantially toward the opposite sidewall of the two sidewalls and toward the rear portion of the cage.

6. The cage as described in claim 1, wherein the cage has a rear cover with a width greater than a length of each of the spring arms, and a free end of the second portion is spaced from the rear cover.

7. The cage as described in claim 1, wherein the cage is made from a single piece of metallic material.

8. A metal small form-factor pluggable transceiver cage adapted to receive a small form-factor pluggable module therein, the cage comprising:
    a bottom wall, a rear cover, two sidewalls, and two spring arms respectively extending from a rear portion of the cage; wherein each of the spring arms has a first portion adjacent a corresponding sidewall and a second portion, the second portion resiliently abutting against the rear cover when the module is received in the cage.

9. The cage as described in claim 8, wherein the second portion extends at an angle from the first portion.

10. The cage as described in claim 8, wherein the first and second portions form an obtuse angle therebetween.

11. The cage as described in claim 8, wherein the rear cover further comprises an inner plate and an outer plate engaged with the inner plate, and the second portion of each of the spring arms resiliently abuts against the outer plate when the module is received in the cage.

12. The cage as described in claim 8, wherein the kick-out spring arms respectively extend from the two sidewalls and cross over each other.

13. A small form-factor pluggable transceiver cage adapted to be mounted to a panel, the cage comprising:
    a metal mainframe including a pair of kick-out spring arms respectively extending inwardly into a receiving cavity defined by the mainframe, the spring arms crossing over each other; and
    a grounding device attached to the mainframe, the grounding device forming at least one outward spring tab adapted to contact a face of the panel.

14. The cage as described in claim 13, wherein each of the spring arms has a first portion adjoining the mainframe, and a second portion extending at an angle from the first portion.

15. The cage as described in claim 14, wherein the kick-out spring arms respectively extend from two sidewalls of the mainframe, the first portion obliquely extends from one of the sidewalls toward an opposite sidewall of the sidewalls and toward a front of the cage, and the second portion extends from the first portion toward said opposite sidewall of the sidewalls and toward a rear of the cage.

16. A transceiver assembly, comprising:
    a metal receptacle having an entrance, and a rear portion opposite to the entrance, a spring arm extending from the rear portion and including a free end;
    a transceiver module received in the receptacle with a portion substantially abutting the spring arm;
    wherein the free end substantially abuts against the rear portion when the transceiver is received therein, and bounces away from the rear portion when the transceiver is removed therefrom.

17. The transceiver assembly as described in claim 16, further comprises a complementary interengaging means arranged between the receptacle and the transceiver module so as to securely position the transceiver module in the receptacle.

18. The transceiver assembly as described in claim 16, wherein the receptacle comprises a spring latch having a hole defined therein, the transceiver module comprises a buckle in a front thereof, and the buckle is press-fitted in the hole when the transceiver module is received in the receptacle.

19. The transceiver assembly as described in claim 16, wherein the spring arms has a frontmost portion resiliently abutting a rear wall of the module and a second portion resiliently abutting the rear wall of the cage, whereby the module is resiliently and securely received in the cage.

20. The cage as described in claim 16, wherein the spring arm has a first portion adjoining the cage, and a second portion extends at an angle from the first portion.

21. The cage as described in claim 16, wherein the cage further comprises a bottom wall and two sidewalls, the first portion obliquely extends from one of the two sidewalls toward an opposite sidewall of the two sidewalls and toward the front of the cage, and the second portion extends from the first portion toward said opposite sidewall of the two sidewalls and toward the rear wall.

22. The cage as described in claim 16, wherein the cage comprises at least two said spring arms crossing over each other.

23. A transceiver assembly comprising:
    a metal receptacle having a front open entrance, a rear wall opposite to said entrance, a pair of curved spring arms extending, around rear edges of two opposite side walls, laterally and inwardly to each other, in a vertically offset manner, and each with a distance being more than one half of a lateral dimension of said rear wall; and
    a transceiver module latchably received within the receptacle under a condition that a rear portion of the transceiver abuts against middle portions of the pair of spring arms and a distal end of each of the spring arms abuts against the rear wall.

* * * * *